(12) United States Patent
Ozaki et al.

(10) Patent No.: US 11,935,870 B2
(45) Date of Patent: Mar. 19, 2024

(54) METHOD FOR MANUFACTURING SEMICONDUCTOR DEVICE HAVING DOLMEN STRUCTURE, METHOD FOR MANUFACTURING SUPPORT PIECE, AND LAMINATED FILM

(71) Applicant: Resonac Corporation, Tokyo (JP)

(72) Inventors: Yoshinobu Ozaki, Tokyo (JP); Kei Itagaki, Tokyo (JP); Kohei Taniguchi, Tokyo (JP); Shintaro Hashimoto, Tokyo (JP); Tatsuya Yahata, Tokyo (JP)

( * ) Notice: Subject to any disclaimer, the term of this patent is extended or adjusted under 35 U.S.C. 154(b) by 171 days.

(21) Appl. No.: 17/439,404

(22) PCT Filed: Apr. 24, 2020

(86) PCT No.: PCT/JP2020/017740
§ 371 (c)(1),
(2) Date: Sep. 15, 2021

(87) PCT Pub. No.: WO2020/218531
PCT Pub. Date: Oct. 29, 2020

(65) Prior Publication Data
US 2022/0149009 A1 May 12, 2022

(30) Foreign Application Priority Data
Apr. 25, 2019 (WO) .................. PCT/JP2019/017692

(51) Int. Cl.
*H01L 25/065* (2023.01)
*H01L 25/00* (2006.01)

(52) U.S. Cl.
CPC .......... *H01L 25/0657* (2013.01); *H01L 25/50* (2013.01); *H01L 2225/0651* (2013.01);
(Continued)

(58) Field of Classification Search
CPC .................. H01L 25/0657; H01L 25/50; H01L 2225/0651; H01L 2225/06562;
(Continued)

(56) References Cited

U.S. PATENT DOCUMENTS 7,459,776 B1    12/2008   St. Amand et al.
7,859,119 B1 *  12/2010   St. Amand .......... H01L 25/0652
                                              257/685
(Continued)

FOREIGN PATENT DOCUMENTS

JP    2002-222889    8/2002
JP    2003-124433    4/2003
(Continued)

OTHER PUBLICATIONS

International Preliminary Report on Patentability with Written Opinion dated Nov. 4, 2021 for PCT/JP2019/017688.
(Continued)

*Primary Examiner* — Timor Karimy
(74) *Attorney, Agent, or Firm* — SOEI PATENT & LAW FIRM

(57) ABSTRACT

One aspect of the present disclosure is a manufacturing method for a support piece used in the formation of a dolmen structure in a semiconductor device, including processes of: (A) preparing a laminate film including a base material film, an adhesive layer, and a support piece formation film, for example, including a thermosetting resin layer, in this order; and (B) forming support pieces on a surface of the adhesive layer by singulating the support piece formation film, in which the process (B) includes a process of forming a cut in the support piece formation film partway in a thickness direction, and a process of singulating the support piece formation film in a cooled state by expansion, in this order.

15 Claims, 12 Drawing Sheets

(52) U.S. Cl.
CPC ............... *H01L 2225/06562* (2013.01); *H01L 2225/06575* (2013.01); *H01L 2225/06582* (2013.01)

(58) Field of Classification Search
CPC ........... H01L 2225/06575; H01L 2225/06582; H10B 80/00
See application file for complete search history.

(56) References Cited

U.S. PATENT DOCUMENTS

| | | |
|---|---|---|
| 2007/0181990 A1 | 8/2007 | Huang et al. |
| 2008/0029885 A1 | 2/2008 | Meir et al. |
| 2010/0219507 A1* | 9/2010 | Misumi ................... H01L 24/32 438/464 |
| 2011/0175222 A1 | 7/2011 | Kim et al. |
| 2013/0270717 A1 | 10/2013 | Ko et al. |
| 2014/0167291 A1 | 6/2014 | Nam et al. |
| 2016/0276223 A1* | 9/2016 | Priewasser ............. H01L 21/78 |

FOREIGN PATENT DOCUMENTS

| | | |
|---|---|---|
| JP | 2006-005333 | 1/2006 |
| JP | 2010-206136 | 9/2010 |
| JP | 2013-131557 | 7/2013 |
| JP | 2015-176906 | 10/2015 |
| JP | 2016-216562 | 12/2016 |
| JP | 2017-515306 | 6/2017 |
| JP | 2019-12841 | * 9/2018 |
| JP | 2019-012841 | 1/2019 |
| TW | 201640642 | 11/2016 |

OTHER PUBLICATIONS

International Preliminary Report on Patentability with Written Opinion dated Nov. 4, 2021 for PCT/JP2019/017692.
International Preliminary Report on Patentability with Written Opinion dated Nov. 4, 2021 for PCT/JP2019/017701.
International Preliminary Report on Patentability with Written Opinion dated Nov. 4, 2021 for PCT/JP2020/017728.
International Preliminary Report on Patentability with Written Opinion dated Nov. 4, 2021 for PCT/JP2020/017731.
International Preliminary Report on Patentability with Written Opinion dated Nov. 4, 2021 for PCT/JP2020/017740.
International Search Report dated Jul. 9, 2019 for PCT/JP2019/017701.
International Search Report dated Jul. 28, 2020 for PCT/JP2020/017728.
International Search Report dated Jul. 9, 2019 for PCT/JP2019/017688.
International Search Report dated Jul. 9, 2019 for PCT/JP2019/017692.
International Search Report dated Jul. 21, 2020 for PCT/JP2020/017731.
International Search Report dated Jul. 28, 2020 for PCT/JP2020/017740.
Soei Patent and Law Firm, Statement of Related Matters, dated Nov. 9, 2021.

* cited by examiner

METHOD FOR MANUFACTURING SEMICONDUCTOR DEVICE HAVING DOLMEN STRUCTURE, METHOD FOR MANUFACTURING SUPPORT PIECE, AND LAMINATED FILM

CROSS-REFERENCE TO RELATED APPLICATION

This application is a 35 U.S.C. § 371 national phase application of PCT/JP2020/017740, filed on Apr. 24, 2020, which claims priority to PCT/JP2019/017692, filed on Apr. 25, 2019.

TECHNICAL FIELD

The present disclosure relates to a manufacturing method for a semiconductor device having a dolmen structure including a substrate, a first chip disposed on the substrate, a plurality of support pieces disposed around the first chip, on the substrate, and a second chip disposed to be supported by the plurality of support pieces and to cover the first chip. In addition, the present disclosure relates to a manufacturing method for a support piece used in the manufacturing of a semiconductor device having a dolmen structure and a laminate film that can be applied to the manufacturing of a support piece. Note that, dolmen is a type of stone tomb, and includes a plurality of pillar stones, and a plate-shaped rock placed on the plurality of pillar stones. In the semiconductor device having a dolmen structure, the support piece corresponds to the "pillar stone", and the second chip corresponds to the "plate-shaped rock".

BACKGROUND ART

Recently, in the field of a semiconductor device, high integration, downsizing, and speed-up have been required. As one aspect of the semiconductor device, a structure in which a semiconductor chip is laminated on a controller chip disposed on a substrate has attracted attention. For example, in Patent Literature 1, a semiconductor die assembly including a controller die, and a memory die supported by a support member on the controller die is disclosed. It can be said that a semiconductor assembly 100 illustrated in FIG. 1A of Patent Literature 1 has a dolmen structure. That is, the semiconductor assembly 100 includes a package substrate 102, a controller die 103 disposed on the surface of the package substrate 102, memory dies 106a and 106b disposed above the controller die 103, and support members 130a and 130b supporting the memory die 106a.

CITATION LIST

Patent Literature

Patent Literature 1: Japanese Unexamined Patent Publication No. 2017-515306

SUMMARY OF INVENTION

Technical Problem

In Patent Literature 1, it is disclosed that as the support member (a support piece), a semiconductor material such as silicon can be used, and more specifically, a fraction of a semiconductor material that is obtained by dicing a semiconductor wafer can be used (refer to [0012], [0014], and FIG. 2 of Patent Literature 1). In order to manufacture a support piece for a dolmen structure by using a semiconductor wafer, as with the manufacturing of the general semiconductor chip, for example, each of the following processes is required:

(1) pasting a back grind tape to a semiconductor wafer;
(2) performing back grinding with respect to the semiconductor wafer;
(3) pasting a film including an adhesive layer and a bonding adhesive layer (a dicing die bonding-integrated film) to a dicing ring and the semiconductor wafer after the back grinding that is disposed in the dicing ring;
(4) peeling off the back grind tape from the semiconductor wafer; and
(5) singulating the semiconductor wafer.

The present disclosure provides a method for efficiently manufacturing a support piece excellent in pickup properties. In addition, the present disclosure provides a method for manufacturing a semiconductor device having a dolmen structure by using the support piece described above.

Solution to Problem

One aspect of the present disclosure relates to a manufacturing method for a support piece used in the manufacturing of a semiconductor device having a dolmen structure. Such a manufacturing method includes the following processes:

(A) preparing a laminate film including a base material film, an adhesive layer, and a support piece formation film, in this order; and
(B) forming support pieces on a surface of the adhesive layer by singulating the support piece formation film.

The support piece formation film is any one of the following films:
a film including a thermosetting resin layer;
a film including a layer in which at least a part of a thermosetting resin layer is cured;
a multi-layer film including a thermosetting resin layer, and a resin layer having rigidity higher than that of the thermosetting resin layer; and
a multi-layer film including a thermosetting resin layer, and a metal layer having rigidity higher than that of the thermosetting resin layer.

The resin layer of the support piece formation film, for example, is a polyimide layer. The resin layer, for example, contains a material different from that of the thermosetting resin layer. The metal layer of the support piece formation film, for example, is a copper layer or an aluminum layer. Note that, the rigidity of the thermosetting resin layer after thermal curing may be lower or higher than the rigidity of the resin layer or the metal layer. The rigidity indicates the ability of an object to endure breaking against bending or twisting.

In a case where the support piece formation film is a film including a thermosetting resin layer, or a film including a layer in which at least a part of a thermosetting resin layer is cured, the process (B) includes a process of forming a cut in the support piece formation film partway in a thickness direction, and a process of singulating the support piece formation film in a cooled state by expansion, in this order. On the other hand, in a case where the support piece formation film is a multi-layer film including a thermosetting resin layer, and a resin layer or a metal layer having rigidity higher than that of the thermosetting resin layer, in the laminate film prepared in the process (A), the thermosetting resin layer is positioned between the resin layer or the metal layer and the adhesive layer, and the process (B) includes a process of forming a cut in the thermosetting resin layer partway in a thickness direction by cutting the resin layer or the metal layer of the support piece formation film, and a process of singulating the support piece formation film in a cooled state by expansion, in this order.

In the process (B), the thermosetting resin layer on the surface of the adhesive layer is half-cut, and then, the thermosetting resin layer is singulated into bonding adhesive pieces by cool expansion. Accordingly, excellent pickup properties of the support piece can be attained. According to the studies of the present inventors, in the process (B), in a case where a cut that penetrates through the thermosetting resin layer and leads to the adhesive layer is formed, the edge of the bonding adhesive piece is likely to intrude into the adhesive layer. Accordingly, the present inventors assume that the pickup properties of the support piece tend to be insufficient. In particular, in a case where the adhesive layer is an ultraviolet-curable adhesive layer, and the adhesive layer is cured by being irradiated with an ultraviolet ray in a state where the edge of the bonding adhesive piece intrudes into the adhesive layer, the edge of the bonding adhesive piece is fixed to the cured adhesive layer, and the pickup properties of the support piece are more likely to be insufficient. In contrast, as described above, in the process (B), since the thermosetting resin layer is half-cut, and then, the thermosetting resin layer is singulated by cool expansion, the edge of the bonding adhesive piece does not intrude into the adhesive layer, and excellent pickup properties can be attained.

In the manufacturing method according to the present disclosure, the support piece obtained by singulating the support piece formation film is used. Accordingly, the process of preparing the support piece can be simplified, compared to the manufacturing method of the related art in which the fraction of the semiconductor material that is obtained by dicing the semiconductor wafer is used as the support piece. That is, in the related art, the processes of (1) to (5) described above were required, whereas since the support piece formation film does not include a semiconductor wafer, the processes of (1), (2), and (4) relevant to the back grinding of the semiconductor wafer can be omitted. In addition, since the semiconductor wafer that is more expensive than a resin material is not used, the cost can also be reduced. Note that, since the thermosetting resin layer has adhesiveness with respect to other members (for example, the substrate), a bonding adhesive layer or the like may not be separately provided on the support piece.

From the viewpoint of further increasing the pickup properties of the support piece, the support piece may be picked up in a state where an interval between the adjacent support pieces is set to be wider than that after the process (B). That is, for example, a film having thermal contractility is used as the base material film, and the adhesive layer includes a circumferential edge region that is not covered with the support piece formation film. Then, in the process (B), the support piece formation film is singulated in a state where a dicing ring is pasted to the circumferential edge region to surround the support piece formation film, and after the process (B), an inside region of the base material film in the dicing ring is heated to contract the inside region of the base material film. According to such a method, the interval between the adjacent support pieces can be widened by imparting a tensile force to a central region of the base material film. Accordingly, the occurrence of a pickup error can be further suppressed, and the visibility of the support piece in a pickup process can be improved.

One aspect of the present disclosure relates to a manufacturing method for a semiconductor device having a dolmen structure. Such a manufacturing method includes a process of forming support pieces on the surface of the adhesive layer through the process (A) and the process (B) described above, and the following processes:

(C) picking up the support piece from the adhesive layer;
(D) disposing a first chip on a substrate;
(E) disposing a plurality of support pieces around the first chip or around a region in which the first chip is to be disposed, on the substrate;
(F) preparing an adhesive piece-attached chip including a second chip, and a bonding adhesive piece provided on one surface of the second chip; and
(G) constructing a dolmen structure by disposing the adhesive piece-attached chip on the surfaces of the plurality of support pieces.

Either the process (D) or the process (E) may be performed first. In a case where the process (D) is performed first, in the process (E), the plurality of support pieces may be disposed around the first chip, on the substrate. On the other hand, in a case where the process (E) is performed first, in the process (E), the plurality of support pieces may be disposed around the region in which the first chip is to be disposed, on the substrate, and then, in the process (D), the first chip may be disposed in the region.

One aspect of the present disclosure relates to a laminate film in which a cut is formed partway. A laminate film according to a first aspect includes a base material film, an adhesive layer, and a support piece formation film including a thermosetting resin layer or a layer in which at least a part of a thermosetting resin layer is cured, in this order, and the support piece formation film has a cut extending in the film partway in a thickness direction, in a surface on a side opposite to a surface facing the adhesive layer. A laminate film according to a second aspect includes a base material film, an adhesive layer, and a support piece formation film including a thermosetting resin layer, and a resin layer or a metal layer having rigidity higher than that of the thermosetting resin layer, in this order, the thermosetting resin layer is positioned between the resin layer or the metal layer and the adhesive layer, and the support piece formation film has a cut extending in the thermosetting resin layer partway in a thickness direction by cutting the resin layer or the metal layer, in a surface on a side opposite to a surface facing the adhesive layer.

Advantageous Effects of Invention

According to the present disclosure, a method for efficiently manufacturing a support piece excellent in pickup properties is provided. In addition, according to the present disclosure, a method for manufacturing a semiconductor device having a dolmen structure by using the support piece described above is provided.

DESCRIPTION OF EMBODIMENTS

Hereinafter, embodiments of the present disclosure will be described in detail, with reference to the drawings. However, the present invention is not limited to the following embodiments. Note that, herein, a "(meth)acrylic acid" indicates an acrylic acid or a methacrylic acid, and "(meth) acrylate" indicates acrylate or methacrylate corresponding thereto. "A or B" may include either A or B, or may include both of A and B.

Herein, the term of "layer" also includes a structure having a shape formed on the entire surface and a structure having a shape formed on a part of the surface when seen in the plan view. In addition, herein, the term of "process" includes not only an independent process, but also a process that is not clearly distinguishable from other processes insofar as a desired function of the process is attained. In addition, a numerical range represented by using "to" indicates a range including numerical values described before and after "to" as a minimum value and a maximum value, respectively.

Herein, in a case where there are a plurality of substances corresponding to each component in a composition, the content of each component in the composition indicates the total amount of the plurality of substances in the composition, unless otherwise noted. In addition, exemplified materials may be independently used, or two or more types thereof may be used by being combined, unless otherwise noted. In addition, in numerical ranges described in stages herein, an upper limit value or a lower limit value of a numerical range in one stage may be replaced with an upper limit value or a lower limit value of a numerical range in another stage. In addition, in a numerical range described herein, an upper limit value or a lower limit value of the numerical range may be replaced with values described in Examples.

(Semiconductor Device)

Figure 1:
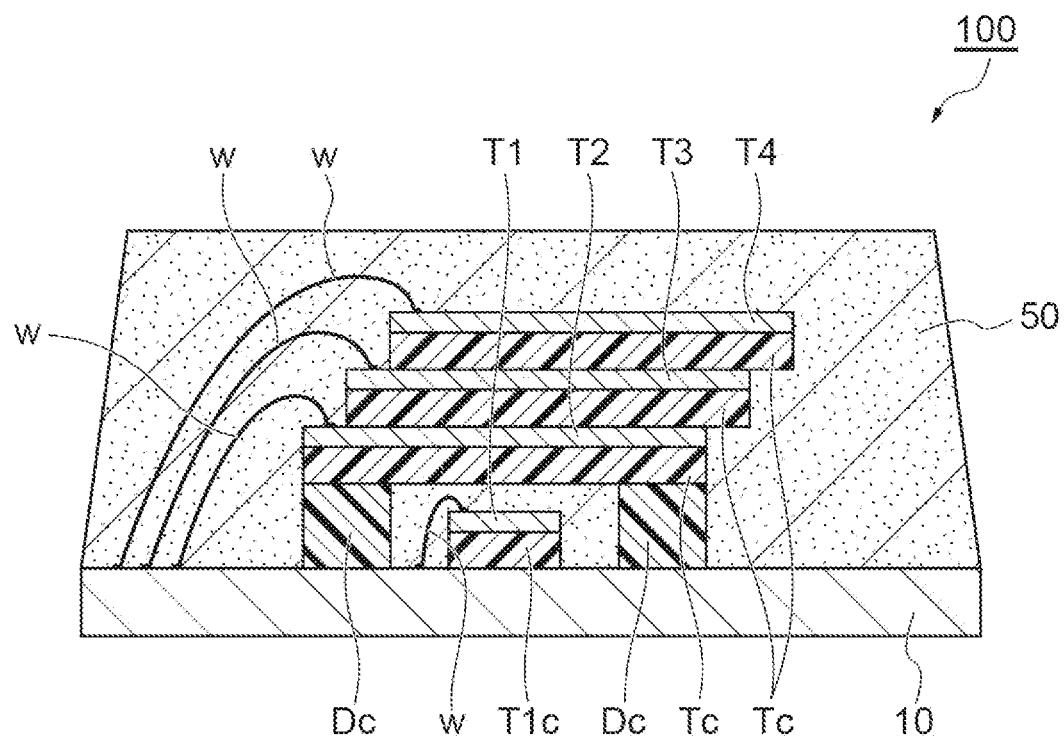
FIG. 1 is a sectional view schematically illustrating an example of a semiconductor device according to the present disclosure.

FIG. 1 is a sectional view schematically illustrating an example of a semiconductor device having a dolmen structure. A semiconductor device 100 illustrated in this drawing includes a substrate 10, a chip T1 (a first chip) disposed on the surface of the substrate 10, a plurality of support pieces Dc disposed around the chip T1, on the surface of the substrate 10, a chip T2 (a second chip) disposed above the chip T1, a bonding adhesive piece Tc interposed between the chip T2 and the plurality of support pieces Dc, chips T3 and T4 laminated on the chip T2, a plurality of wires w electrically connecting an electrode (not illustrated) on the surface of the substrate 10 and the chips T1 to T4, respectively, and a sealing material 50 filled in a gap between the chip T1 and the chip T2, or the like.

In this embodiment, the plurality of support pieces Dc, the chip T2, and the bonding adhesive piece Tc positioned between the support piece Dc and the chip T2 configure a dolmen structure on the substrate 10. The chip T1 is apart from the bonding adhesive piece Tc. By suitably setting the thickness of the support piece Dc, a space for the wire w connecting an upper surface of the chip T1 and the substrate 10 can be ensured. Since the chip T1 is apart from the bonding adhesive piece Tc, short circuit of the wire w due to a contact between an upper portion of the wire w connected to the chip T1 and the chip T2 can be prevented. In addition, since it is not necessary that the wire is embedded in the bonding adhesive piece Tc that is in contact with the chip T2, there is an advantage that the bonding adhesive piece Tc can be thinned.

As illustrated in FIG. 1, the bonding adhesive piece Tc between the chip T1 and the chip T2 covers a region of the chip T2 facing the chip T1 and continuously extends to the circumferential edge side of the chip T2 from the region. That is, one bonding adhesive piece Tc covers the region of the chip T2 and adheres the chip T2 and the plurality of support pieces to each other by being interposed therebetween. Note that, in FIG. 1, an aspect is illustrated in which the bonding adhesive piece Tc is provided to cover the entire one surface (a lower surface) of the chip T2. However, since the bonding adhesive piece Tc can be contracted in a manufacturing procedure of the semiconductor device 100, the bonding adhesive piece Tc may substantially cover the entire one surface (the lower surface) of the chip T2, and for example, there may be a portion that is not covered with the bonding adhesive piece Tc in a part of the circumferential edge of the chip T2. In FIG. 1, the lower surface of the chip T2 corresponds to a back surface of a chip. Recently, concavities and convexities are commonly formed on the back surface of the chip. Since substantially the entire back surface of the chip T2 is covered with the bonding adhesive piece Tc, the occurrence of a crack or a split on the chip T2 can be suppressed.

The substrate 10 may be an organic substrate, or may be a metal substrate such as a lead frame. The thickness of substrate 10, for example, is 90 to 300 μm, and may be 90 to 210 μm, from the viewpoint of suppressing the warpage of the semiconductor device 100.

The chip T1, for example, is a controller chip, and is adhered to the substrate 10 by a bonding adhesive piece T1c and is electrically connected to the substrate 10 by the wire w. The shape of the chip T1 in the planar view, for example, is a quadrangular shape (a square shape or a rectangular shape). The length of one side of the chip T1, for example, is less than or equal to 5 mm, and may be 2 to 5 mm or 1 to 5 mm. The thickness of the chip T1, for example, is 10 to 150 μm, and may be 20 to 100 μm.

The chip T2, for example, is a memory chip, and is adhered onto the support piece Dc via the bonding adhesive piece Tc. The chip T2 has a size larger than that of the chip T1, in the planar view. The shape of the chip T2 in the planar view, for example, is a quadrangular shape (a square shape or a rectangular shape). The length of one side of the chip T2, for example, is less than or equal to 20 mm, and may be 4 to 20 mm or 4 to 12 mm. The thickness of the chip T2, for example, is 10 to 170 µm, and may be 20 to 120 µm. Note that, the chips T3 and T4, for example, are a memory chip, and are adhered onto the chip T2 via the bonding adhesive piece Tc. The length of one side of the chips T3 and T4 may be identical to that of the chip T2, and the thickness of the chips T3 and T4 may also be identical to that of the chip T2.

Figure 2A:
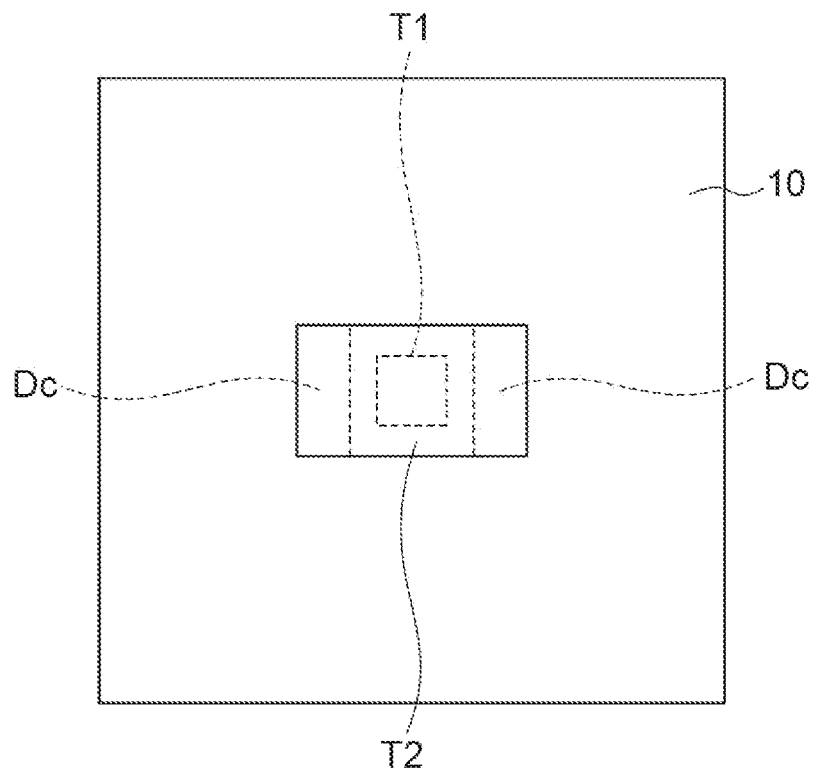
FIG. 2A and FIG. 2B are plan views schematically illustrating an example of a positional relationship between a first chip and a plurality of support pieces.
Figure 2B:
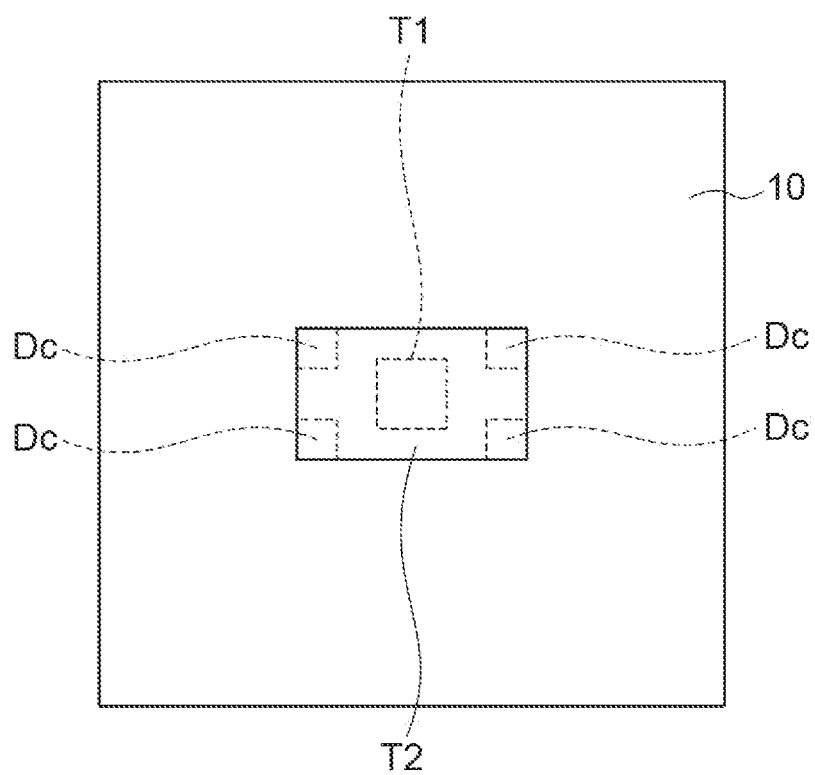

The support piece Dc serves in the role of a spacer for forming a space around the chip T1. The support piece Dc contains a cured product of a thermosetting resin composition. Note that, as illustrated in FIG. 2A, two support pieces Dc (Shape: a rectangular shape) may be disposed in separated positions on both sides of the chip T1, or as illustrated in FIG. 2B, one support piece Dc (Shape: a square shape, a total of 4) may be disposed in each position corresponding to the corner of the chip T1. The length of one side of the support piece Dc in the planar view, for example, is less than or equal to 20 mm, and may be 1 to 20 mm or 1 to 12 mm. The thickness (the height) of the support piece Dc, for example, is 10 to 180 µm, and may be 20 to 120 µm.

(Manufacturing Method for Support Piece)

Figure 3A:
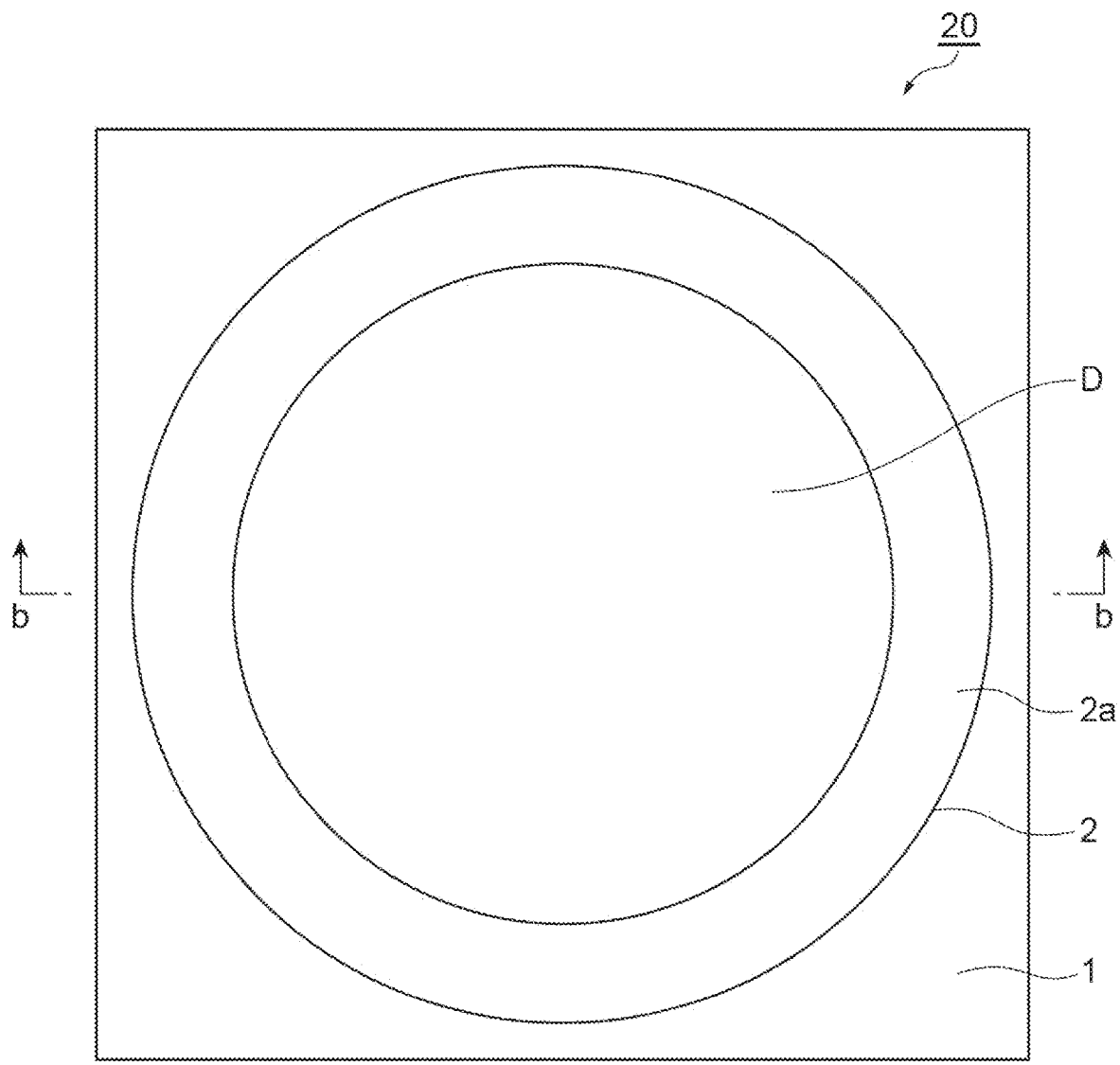
FIG. 3A is a plan view schematically illustrating an example of a support piece formation laminate film.
Figure 3B:
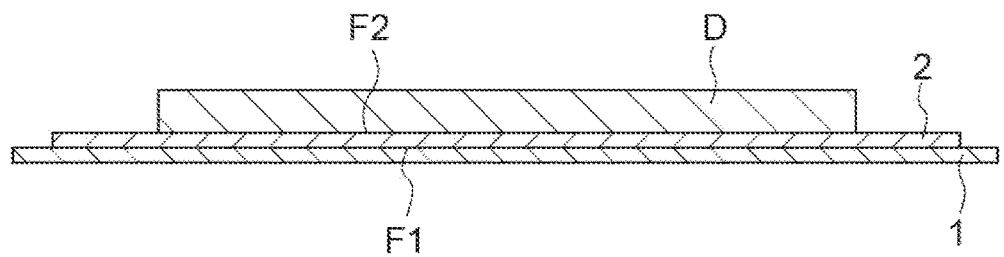
FIG. 3B is a sectional view taken along line b-b of FIG. 3A.

A manufacturing method for a support piece according to this embodiment includes the following processes:

(A) preparing a support piece formation laminate film 20 (hereinafter, may be referred to as a "laminate film 20".) including a base material film 1, an adhesive layer 2, and a support piece formation film D, in this order (refer to FIG. 3A and FIG. 3B); and (B) forming of support pieces Da on the surface of the adhesive layer 2 by singulating the support piece formation film D (refer to FIG. 5C).

Note that, the support piece Dc illustrated in FIG. 1 is in a state after the thermosetting resin composition is cured. On the other hand, the support piece Da is in a state before the thermosetting resin composition is completely cured.

[Process (A)]

The laminate film 20 includes the base material film 1, the adhesive layer 2, and the support piece formation film D. The base material film 1, for example, is a polyethylene terephthalate film (a PET film) or a polyolefin film, and it is preferable that the base material film 1 has thermal contractility. The adhesive layer 2 includes a first surface F1 facing the base material film 1, and a second surface F2 on a side opposite to the first surface F1. The adhesive layer 2 is formed into a circular shape by punching or the like (refer to FIG. 3A). The adhesive layer 2 contains an ultraviolet-curable adhesive agent. That is, the adhesive layer 2 has properties of decreasing adhesiveness by being irradiated with an ultraviolet ray. The support piece formation film D is formed into a circular shape by punching or the like, and has a diameter smaller than that of the adhesive layer 2 (refer to FIG. 3A). The support piece formation film D contains a thermosetting resin composition.

The thermosetting resin composition configuring the support piece formation film D can be in a semi-cured (a B-stage) state, and then, in a completely cured product (a C-stage) state by the subsequent curing treatment. The thermosetting resin composition contains an epoxy resin, a curing agent, and an elastomer (for example, an acrylic resin), and as necessary, further contains an inorganic filler, a curing accelerator, and the like. The details of the thermosetting resin composition configuring the support piece formation film D will be described below.

Figure 4:
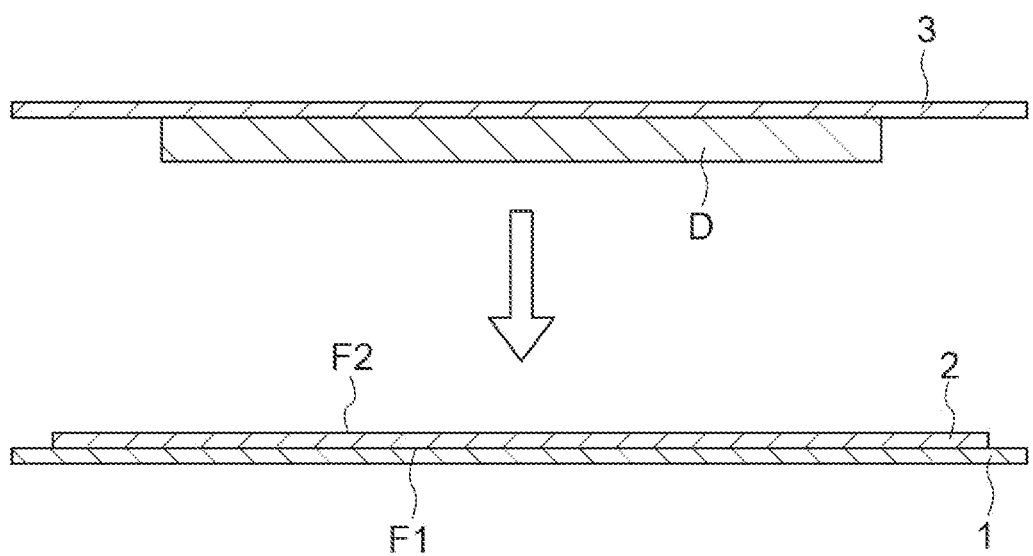
FIG. 4 is a sectional view schematically illustrating a process of bonding an adhesive layer and a support piece formation film.

The laminate film 20, for example, can be prepared by bonding a first laminate film including the base material film 1 and the adhesive layer 2 on the surface of the base material film 1, and a second laminate film including a cover film 3 and the support piece formation film D on the surface of the cover film 3 (refer to FIG. 4). The first laminate film is obtained through a process of forming the adhesive layer on the surface of the base material film 1 by coating, and a process of processing the adhesive layer into a predetermined shape (for example, a circular shape) by punching or the like. The second laminate film is obtained through a process of forming the support piece formation film on the surface of the cover film 3 (for example, a PET film or a polyethylene film) by coating, and a process of processing the support piece formation film into a predetermined shape (for example, a circular shape) by punching or the like. When the laminate film 20 is used, the cover film 3 is peeled off at a suitable timing.

[Process (B)]

Figure 5A:
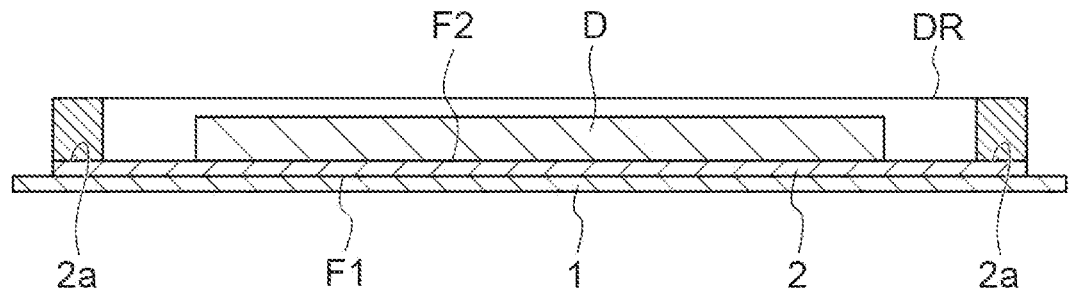
FIG. 5A to FIG. 5C are sectional views schematically illustrating a preparation procedure of a support piece.
Figure 5B:
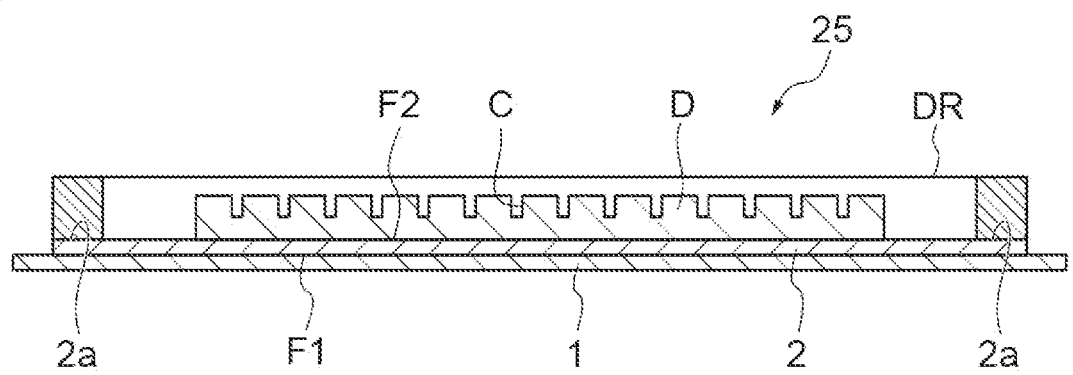
Figure 5C:
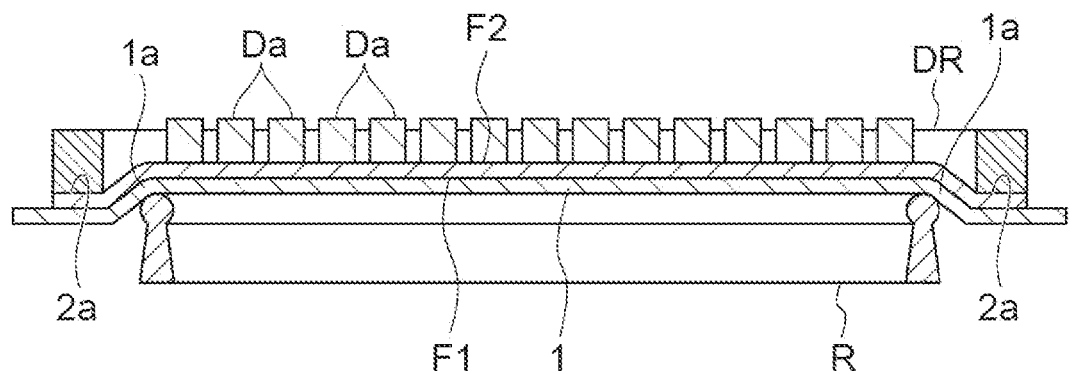
Figure 7:
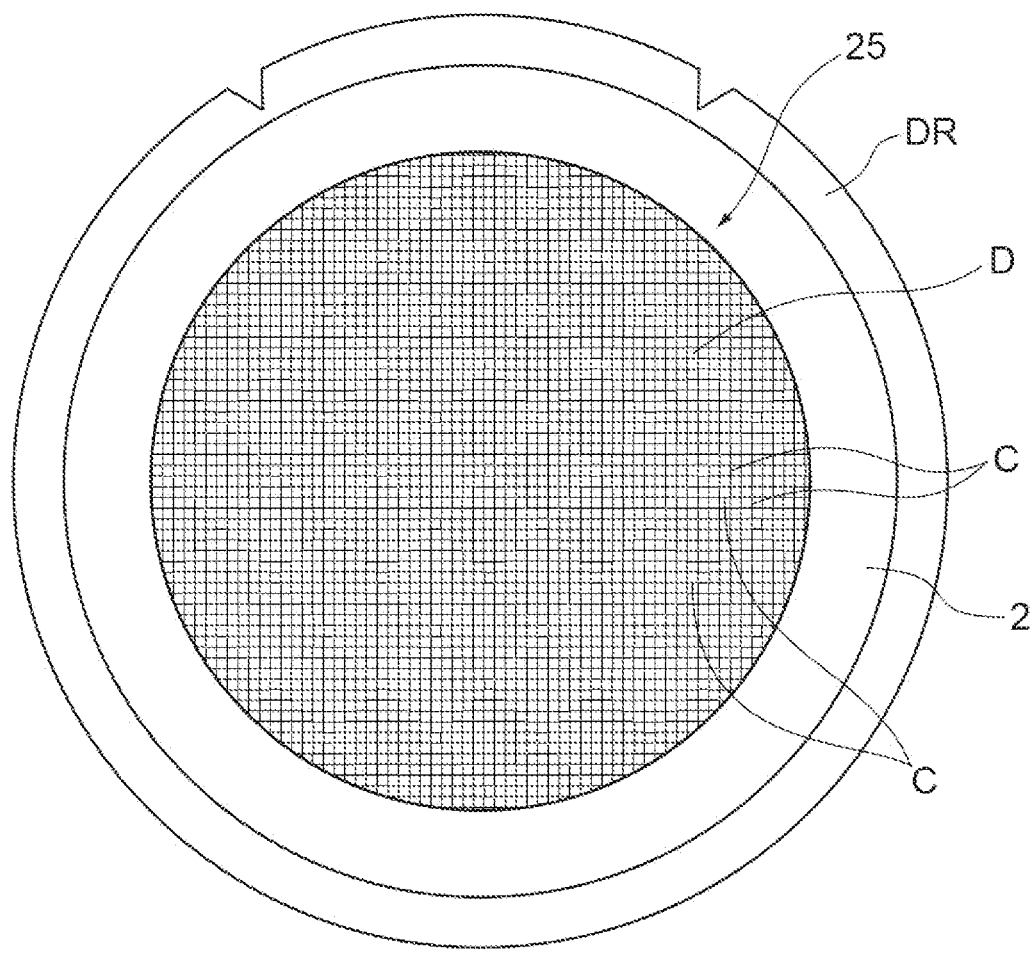
FIG. 7 is a plan view schematically illustrating an example of a half-cut support piece formation film.

As illustrated in FIG. 5A, a dicing ring DR is pasted to the laminate film 20. That is, the dicing ring DR is pasted to a circumferential edge region 2a of the adhesive layer 2 such that the support piece formation film D is disposed inside the dicing ring DR. Next, as illustrated in FIG. 5B, a cut C is formed in the support piece formation film D partway in a thickness direction. Accordingly, a laminate film 25 including the half-cut support piece formation film D is obtained. That is, the laminate film 25 includes the base material film 1, the adhesive layer 2, and the support piece formation film D, in this order, and the support piece formation film D has the cut C in the support piece formation film D partway in the thickness direction, in a surface on a side opposite to a surface facing the adhesive layer 2. The cut C, for example, may be formed by a blade or a laser. In a case where the thickness of the support piece formation film D is set to 100, the depth of the cut C may be 10 to 75, and may be 25 to 50. The cut C is formed into the shape of a grid (refer to FIG. 7). Note that, the pattern of the cut C is not limited to the shape of a grid, and may be a pattern according to the shape of the support piece Da. As illustrated in FIG. 7, it is preferable that the cut C is formed to the outer edge of the support piece formation film D. The diameter of the support piece formation film D, for example, may be 300 to 310 mm or 300 to 305 mm. The shape of the support piece formation film D in the planar view is not limited to a circular shape illustrated in FIG. 3A, and may be a quadrangular shape (a square shape or a rectangular shape).

After that, for example, the support piece formation film D is singulated by cool expansion in a temperature condition of −15 to 0° C. Accordingly, the support pieces Da are obtained from the support piece formation film D. As illustrated in FIG. 5C, a tensile force may be imparted to the base material film 1 by thrusting up an inside region 1a of the base material film 1 in the dicing ring DR with a ring R. In the process (B), since the support piece formation film D is half-cut, and then, the support piece formation film D is singulated by cool expansion, the edge of the support piece Da does not intrude into the adhesive layer 2, and excellent pickup properties can be attained.

Figure 6A:
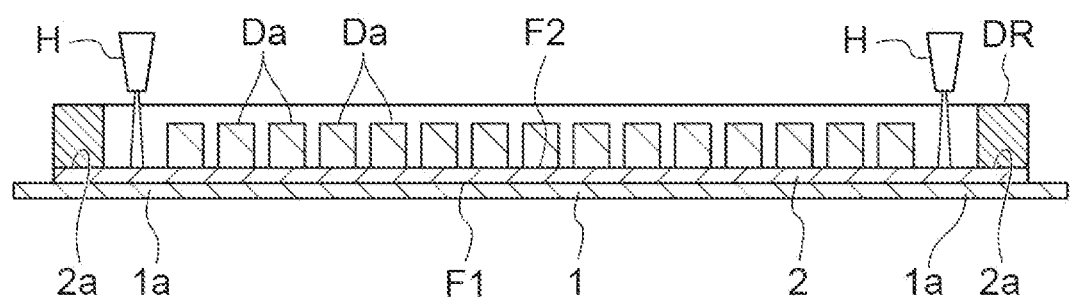
FIG. 6A is a sectional view schematically illustrating a state in which an inside region of a base material film is heated by the blow of a heater.

In a case where a film having thermal contractility is used as the base material film 1, after the process (B), the inside region 1a of the base material film 1 in the dicing ring DR may be heated to contract the inside region 1a. FIG. 6A is a sectional view schematically illustrating a state in which the inside region 1a is heated by the blow of a heater H. An interval between the adjacent support pieces Da can be widened by contracting the inside region 1a into an annular shape and by imparting a tensile force to the base material film 1. Accordingly, the occurrence of a pickup error can be further suppressed, and the visibility of the support piece Da in a pickup process can be improved.

(Manufacturing Method for Semiconductor Device)

Figure 6B:
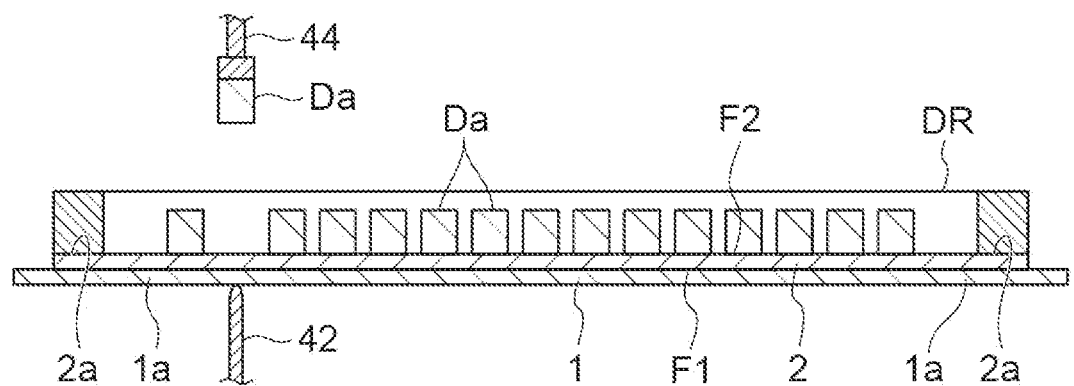
FIG. 6B is a sectional view schematically illustrating a state in which a support piece is picked up from an adhesive layer.

A manufacturing method for the semiconductor device 100 will be described. A manufacturing method according to this embodiment includes a process of forming support pieces Da on the surface of the adhesive layer 2 through the process (A) and the process (B) described above, and the following processes:

(C) picking up the support piece Da from the adhesive layer 2 (refer to FIG. 6B)

Figure 8:
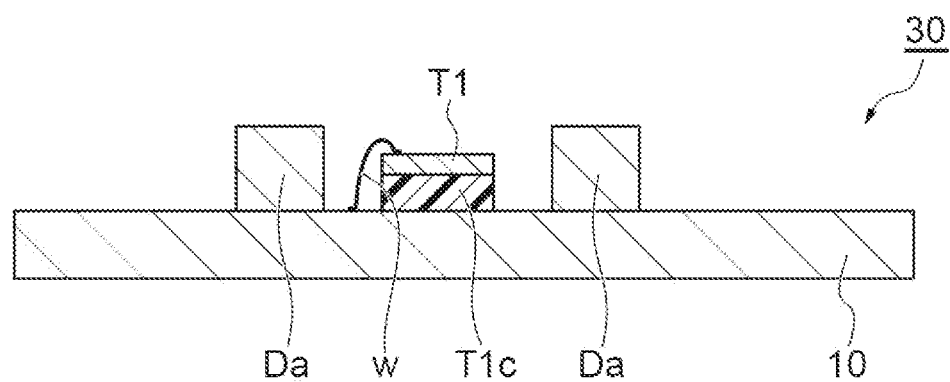
FIG. 8 is a sectional view schematically illustrating a state in which a plurality of support pieces are disposed around a first chip, on a substrate.

(D) disposing the first chip T1 on the substrate 10;

(E) disposing a plurality of support pieces Da around the first chip T1, on the substrate 10 (refer to FIG. 8)

Figure 9:
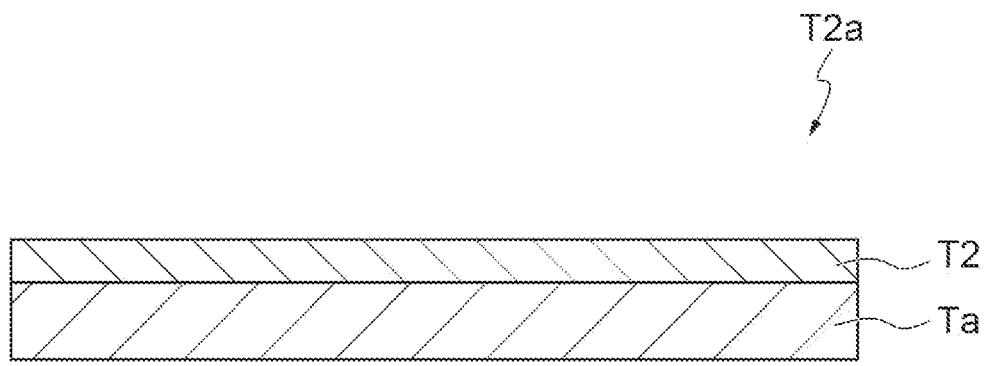
FIG. 9 is a sectional view schematically illustrating an example of an adhesive piece-attached chip.

(F) preparing an adhesive piece-attached chip T2a including a second chip T2, and a bonding adhesive piece Ta provided on one surface of the second chip T2 (refer to FIG. 9)

Figure 10:
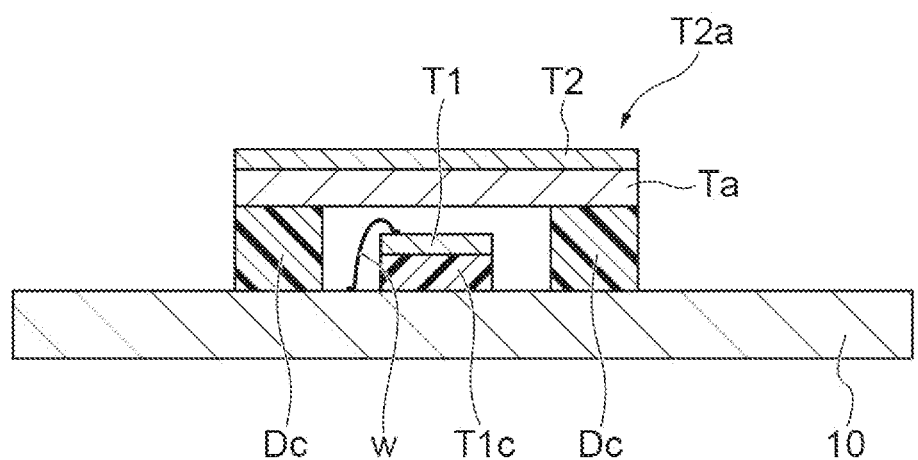
FIG. 10 is a sectional view schematically illustrating a dolmen structure formed on a substrate.

(G) constructing a dolmen structure by disposing the adhesive piece-attached chip T2a on the surfaces of the plurality of support pieces Dc (refer to FIG. 10); and (H) sealing the gap between the chip T1 and the chip T2, or the like, with the sealing material 50 (refer to FIG. 1).

[Process (C)]

The process (C) is a process of picking up the support piece Da from the adhesive layer 2. First, the adhesive layer 2 is irradiated with an ultraviolet ray to decrease an adhesive force between the adhesive layer 2 and the support piece Da. After that, as illustrated in FIG. 6B, the support piece Da is thrust up by a thrust-up jig 42 such that the support piece Da is peeled off from the adhesive layer 2 and the support piece Da is picked up by being sucked with a suction collet 44. Note that, a curing reaction of a thermosetting resin may be advanced by heating the support piece formation film D before dicing or the support piece Da before pickup. Since the support piece Da is suitably cured at the time of being picked up, excellent pickup properties can be attained. Note that, even in the process (C), a tensile force may be imparted to the base material film 1 by using the ring R illustrated in FIG. 5C.

[Process (D)]

The process (D) is a process of disposing the first chip T1 on the substrate 10. For example, first, the chip T1 is disposed in a predetermined position on the substrate 10 via the bonding adhesive layer T1c. After that, the chip T1 is electrically connected to the substrate 10 by the wire w. The process (D) may be a process performed before the process (E), or may be a process performed before the process (A), between the process (A) and the process (B), between the process (B) and the process (C), or between the process (C) and the process (E).

[Process (E)]

The process (E) is a process of disposing the plurality of support pieces Da around the first chip T1, on the substrate 10. Through this process, a structural body 30 illustrated in FIG. 8 is prepared. The structural body 30 includes the substrate 10, and the chip T1 and the plurality of support pieces Da disposed on the surface of the substrate 10. The support piece Da may be disposed by a compression treatment. It is preferable that the compression treatment, for example, is performed in a condition of 80 to 180° C. and 0.01 to 0.50 MPa, for 0.5 to 3.0 seconds. Note that, the support piece Da may become the support piece Dc by being completely cured at a time point of the process (E), or may not be completely cured at the time point. It is preferable that the support piece Da becomes the support piece Dc by being completely cured at a time point before the process (G) starts.

[Process (F)]

The process (F) is a process of preparing the adhesive piece-attached chip T2a illustrated in FIG. 9. The adhesive piece-attached chip T2a includes the chip T2, and the bonding adhesive piece Ta provided on one surface of the chip T2. The adhesive piece-attached chip T2a, for example, can be obtained by using a semiconductor wafer and a dicing die bonding-integrated film through a dicing process and a pickup process.

[Process (G)]

The process (G) is a process of disposing the adhesive piece-attached chip T2a above the chip T1 such that the bonding adhesive piece Ta is in contact with the upper surfaces of the plurality of support pieces Dc. Specifically, the chip T2 is compressed against the upper surface of the support piece Dc via the bonding adhesive piece Ta. It is preferable that such a compression treatment, for example, is performed in a condition of 80 to 180° C. and 0.01 to 0.50 MPa, for 0.5 to 3.0 seconds. Next, the bonding adhesive piece Ta is cured by heating. It is preferable that such a curing treatment, for example, is performed in a condition of 60 to 175° C. and 0.01 to 1.0 MPa, for longer than or equal to 5 minutes. Accordingly, the bonding adhesive piece Ta is cured to be the bonding adhesive piece Tc. Through this process, the dolmen structure is constructed on the substrate 10 (refer to FIG. 10). Since the chip T1 is apart from the adhesive piece-attached chip T2a, the short circuit of the wire w due to the contact between the upper portion of the wire w and the chip T2 can be prevented. In addition, since it is not necessary that the wire is embedded in the bonding adhesive piece Ta that is in contact with the chip T2, there is an advantage that the bonding adhesive piece Ta can be thinned.

The chip T3 is disposed on the chip T2 via a bonding adhesive piece, and the chip T4 is disposed on the chip T3 via a bonding adhesive piece, before the process (H) and after the process (G). The bonding adhesive piece may contain the same thermosetting resin composition as that of the bonding adhesive piece Ta described above, and becomes the bonding adhesive piece Tc by heating and curing (refer to FIG. 1). On the other hand, each of the chips T2, T3, and T4 is electrically connected to the substrate 10 by the wire w. Note that, the number of chips to be laminated above the chip T1 is not limited to 3 described in this embodiment, and may be suitably set.

[Process (H)]

The process (H) is a process of sealing the gap between the chip T1 and the chip T2, or the like, with the sealing material 50. Through this process, the semiconductor device 100 illustrated in FIG. 1 is completed.

(Thermosetting Resin Composition Configuring Support Piece Formation Film)

As described above, the thermosetting resin composition configuring the support piece formation film D contains the epoxy resin, the curing agent, and the elastomer, and as necessary, further contains the inorganic filler, the curing accelerator, and the like. According to the studies of the present inventors, it is preferable that the support piece Da and the support piece Dc after curing have the following properties:

Property 1: when the support piece Da is thermally compressed in a predetermined position of the substrate 10, a position shift is less likely to occur (a melt viscosity of the support piece Da at 120° C., for example, is 4300 to 50000 Pa·s or 5000 to 40000 Pa·s);

Property 2: in the semiconductor device 100, the support piece Dc exhibits stress relieving properties (the thermosetting resin composition contains the elastomer (a rubber component));

Property 3: adhesion strength with respect to the bonding adhesive piece Tc of the adhesive piece-attached chip is sufficiently high (die shear strength of the support piece Dc with respect to the bonding adhesive piece Tc, for example, is 2.0 to 7.0 Mpa or 3.0 to 6.0 Mpa);

Property 4: a contraction rate associated with curing is sufficiently small;

Property 5: the visibility of the support piece Da by a camera is excellent in the pickup process (the thermosetting resin composition, for example, contains a colorant); and Property 6: the support piece Dc has sufficient mechanical strength.

[Epoxy Resin]

The epoxy resin is not particularly limited insofar as having an adhesion function by curing. A difunctional epoxy resin such as a bisphenol A type epoxy resin, a bisphenol F type epoxy resin, and a bisphenol S type epoxy resin, a novolac type epoxy resin such as a phenol novolac type epoxy resin and a cresol novolac type epoxy resin, and the like can be used. In addition, generally known epoxy resins such as a polyfunctional epoxy resin, a glycidyl amine type epoxy resin, a heterocyclic ring-containing epoxy resin, or an alicyclic epoxy resin can be applied. One type of the epoxy resins may be independently used, or two or more types thereof may be used together.

[Curing Agent]

Examples of the curing agent include a phenolic resin, an ester compound, aromatic amine, aliphatic amine, and an acid anhydride. Among them, the phenolic resin is preferable from the viewpoint of attaining high die shear strength. Examples of a commercially available product of the phenolic resin include LF-4871 (Product Name, a BPA novolac type phenolic resin), manufactured by DIC Corporation, HE-100C-30 (Product Name, a phenyl aralkyl type phenolic resin), manufactured by AIR WATER INC., PHENOLITE KA and TD series, manufactured by DIC Corporation, Milex XLC-series and XL series (for example, Milex XLC-LL), manufactured by Mitsui Chemicals, Inc., HE series (for example, HE100C-30), manufactured by AIR WATER INC., MEHC-7800 series (for example, MEHC-7800-4S), manufactured by MEIWA PLASTIC INDUSTRIES, LTD., and JDPP series, manufactured by JFE Chemical Corporation. One type of the curing agents may be independently used, or two or more types thereof may be used together.

In a compounding amount of the epoxy resin and the phenolic resin, an equivalent ratio of an epoxy equivalent and a hydroxyl group equivalent is preferably 0.6 to 1.5, is more preferably 0.7 to 1.4, and is even more preferably 0.8 to 1.3, from the viewpoint of attaining high die shear strength. By setting a compounding ratio to be in the range described above, both of curing properties and fluidity are easily attained to a sufficiently high level.

[Elastomer]

Examples of the elastomer include an acrylic resin, a polyester resin, a polyamide resin, a polyimide resin, a silicone resin, polybutadiene, acrylonitrile, epoxy-modified polybutadiene, maleic anhydride-modified polybutadiene, phenol-modified polybutadiene, and carboxy-modified acrylonitrile.

As the elastomer, an acrylic resin is preferable, and an acrylic resin such as an epoxy group-containing (meth) acrylic copolymer obtained by polymerizing a functional monomer having an epoxy group or a glycidyl group as a cross-linkable functional group, such as glycidyl acrylate or glycidyl methacrylate, is more preferable, from the viewpoint of attaining high die shear strength. Among the acrylic resins, an epoxy group-containing (meth)acrylic acid ester copolymer and epoxy group-containing acrylic rubber are preferable, and the epoxy group-containing acrylic rubber is more preferable. The epoxy group-containing acrylic rubber is rubber having an epoxy group that contains acrylic acid ester as a main component and mainly contains a copolymer such as butyl acrylate and acrylonitrile, and a copolymer such as ethyl acrylate and acrylonitrile, and the like. Note that, the acrylic resin may have not only the epoxy group but also a cross-linkable functional group such as alcoholic or phenolic hydroxyl group and carboxyl group.

Examples of a commercially available product of the acrylic resin include SG-70L, SG-708-6, WS-023 EK30, SG-280 EK23, and a SG-P3 solvent-changed product (Product Name, acrylic rubber, Weight Average Molecular Weight: 800000, Tg: 12° C., Solvent: cyclohexanone), manufactured by Nagase ChemteX Corporation, and the like.

A glass transition temperature (Tg) of the acrylic resin is preferably −50 to 50° C., and is more preferably −30 to 30° C., from the viewpoint of attaining high die shear strength. A weight average molecular weight (Mw) of the acrylic resin is preferably 100000 to 3000000, and is more preferably 500000 to 2000000, from the viewpoint of attaining high die shear strength. Here, Mw indicates a value that is measured by gel permeation chromatography (GPC) and is converted by using a calibration curve of standard polystyrene. Note that, there is a tendency that a highly elastic bonding adhesive piece can be formed by using the acrylic resin having a narrow molecular weight distribution.

The amount of acrylic resin contained in the thermosetting resin composition is preferably 10 to 200 parts by mass, and is more preferably 20 to 100 parts by mass, with respect to the total of 100 parts by mass of the epoxy resin and an epoxy resin curing agent, from the viewpoint of attaining high die shear strength.

[Inorganic Filler]

Examples of the inorganic filler include aluminum hydroxide, magnesium hydroxide, calcium carbonate, magnesium carbonate, calcium silicate, magnesium silicate, calcium oxide, magnesium oxide, aluminum oxide, aluminum nitride, aluminum borate whisker, boron nitride, crystalline silica, and amorphous silica. One type of the inorganic fillers may be independently used, or two or more types thereof may be used together.

An average particle diameter of the inorganic filler is preferably 0.005 μm to 1.0 and is more preferably 0.05 to 0.5 μm, from the viewpoint of attaining high die shear strength. It is preferable that the surface of the inorganic filler is chemically modified, from the viewpoint of attaining high die shear strength. A silane coupling agent is suitable as a material for chemically modifying the surface. Examples of the type of functional group of the silane coupling agent include a vinyl group, an acryloyl group, an epoxy group, a mercapto group, an amino group, a diamino group, an alkoxy group, and an ethoxy group.

The content of the inorganic filler is preferably 20 to 200 parts by mass, and is more preferably 30 to 100 parts by mass, with respect to 100 parts by mass of resin components of the thermosetting resin composition, from the viewpoint of attaining high die shear strength.

[Curing Accelerator]

Examples of the curing accelerator include imidazoles and derivatives thereof, an organic phosphorus-based compound, secondary amines, tertiary amines, and a quaternary ammonium salt. An imidazole-based compound is preferable from the viewpoint of attaining high die shear strength. Examples of the imidazoles include 2-methyl imidazole, 1-benzyl-2-methyl imidazole, 1-cyanoethyl-2-phenyl imidazole, 1-cyanoethyl-2-methyl imidazole, and the like. One type of the curing accelerators may be independently used, or two or more types thereof may be used together.

The content of the curing accelerator in the thermosetting resin composition is preferably 0.04 to 3 parts by mass, and is more preferably 0.04 to 0.2 parts by mass, with respect to the total of 100 parts by mass of the epoxy resin and the epoxy resin curing agent, from the viewpoint of attaining high die shear strength.

As described above, the embodiments of the present disclosure have been described in detail, but the present invention is not limited to the embodiments described above. For example, in the embodiments described above, the laminate film 20 including the ultraviolet-curable adhesive layer 2 has been exemplified, but the adhesive layer 2 may be a pressure-sensitive adhesive layer. Note that, the pressure-sensitive adhesive layer may or may not contain a resin having a photoreactive carbon-carbon double bond. For example, a predetermined region of the adhesive layer may be irradiated with an ultraviolet ray to decrease the adhesiveness of the region, and for example, the resin having a photoreactive carbon-carbon double bond may remain.

Figure 11A:
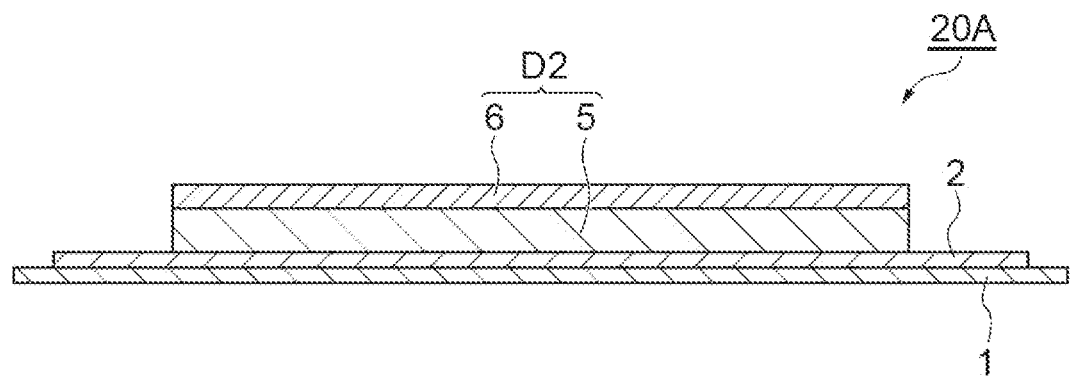
FIG. 11A and FIG. 11B are sectional views schematically illustrating other embodiments of the support piece formation laminate film, respectively.

In the embodiments described above, as illustrated in FIG. 3B, the support piece formation laminate film 20 including the support piece formation film D including the thermosetting resin layer has been exemplified, but the support piece formation laminate film may include a layer in which at least a part of a thermosetting resin layer is cured. In addition, the support piece formation laminate film may include a multi-layer film including a thermosetting resin layer, and a resin layer or a metal layer having rigidity higher than that of the thermosetting resin layer. A support piece formation laminate film 20A illustrated in FIG. 11A includes a two-layer film D2 (a support piece formation film) including a thermosetting resin layer 5, and a resin layer 6 having rigidity higher than that of the thermosetting resin layer. That is, in the support piece formation laminate film 20A, the thermosetting resin layer 5 is disposed between the adhesive layer 2 and the resin layer 6 that is the outermost surface. Note that, the thermosetting resin layer 5 contains the thermosetting resin composition configuring the support piece formation film D according to the first embodiment. The thickness of the resin layer 6, for example, is 5 to 100 μm, and may be 10 to 90 μm or 20 to 80 μm. The resin layer 6, for example, is a polyimide layer.

Figure 11B:
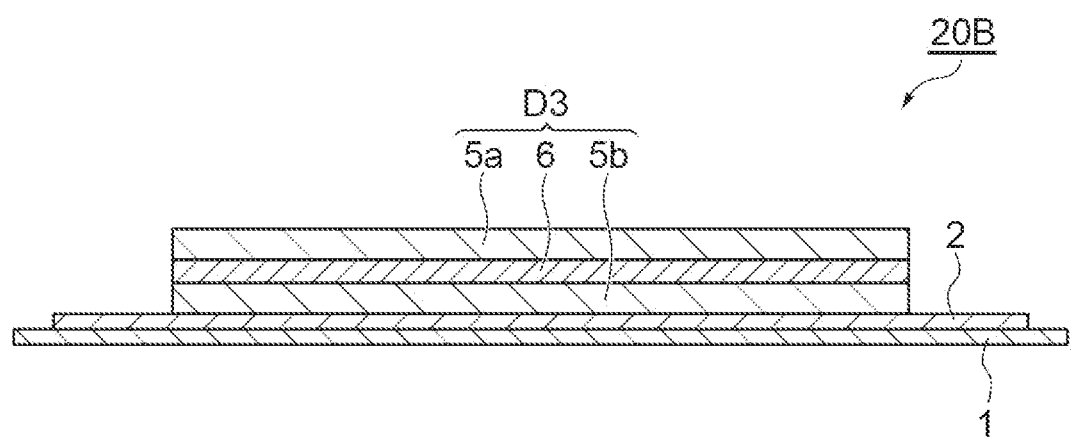

A support piece formation laminate film 20B illustrated in FIG. 11B includes a three-layer film D3 (a support piece formation film) including the resin layer 6 having rigidity higher than that of the thermosetting resin layer, and two thermosetting resin layers 5a and 5b interposing the resin layer 6 therebetween. In the support piece formation laminate film 20B, the three-layer film D3 is disposed on the surface of the adhesive layer 2.

Figure 12A:
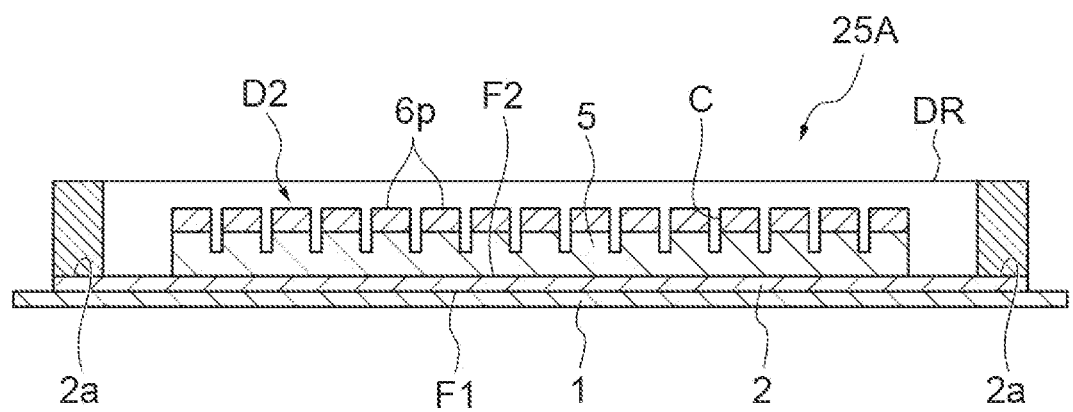
FIG. 12A is a sectional view schematically illustrating a state in which a two-layer film illustrated in FIG. 11A is half-cut.

FIG. 12A is a sectional view schematically illustrating a state in which the two-layer film D2 is half-cut. In the process (B), the cut C may be formed in the thermosetting resin layer 5 partway in a thickness direction by cutting the resin layer 6 of the two-layer film D2. Accordingly, a laminate film 25A including the half-cut two-layer film D2 is obtained. That is, the laminate film 25A includes the base material film 1, the adhesive layer 2, and the half-cut two-layer film D2, in this order. As illustrated in FIG. 12A, the two-layer film D2 has the cut C extending in thermosetting resin layer 5 partway in the thickness direction by cutting the resin layer 6, in a surface on a side opposite to a surface facing the adhesive layer 2. Resin pieces 6p are formed by singulating the resin layer 6.

Figure 12B:
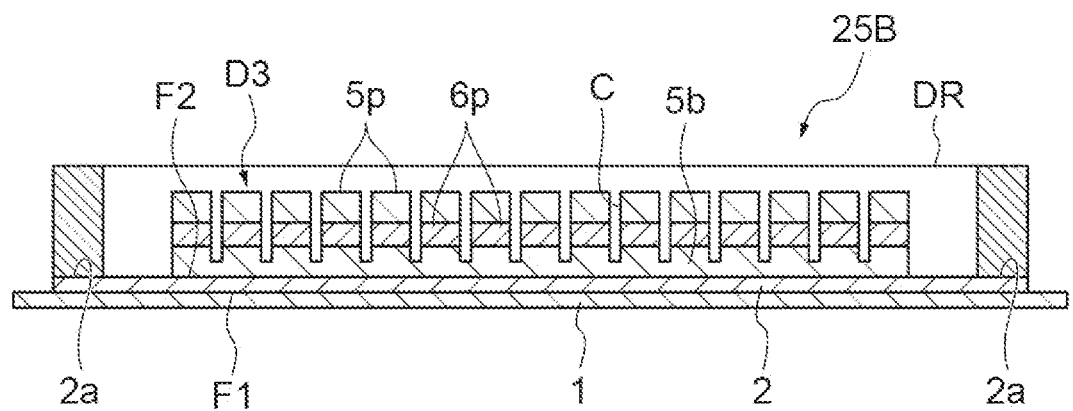
FIG. 12B is a sectional view schematically illustrating a state in which a three-layer film illustrated in FIG. 11B is half-cut.

FIG. 12B is a sectional view schematically illustrating a state in which the three-layer film D3 is half-cut. In the process (B), the cut C may be formed in the thermosetting resin layer 5b partway in a thickness direction by cutting the thermosetting resin layer 5a and the resin layer 6 of the three-layer film D3. Accordingly, a laminate film 25B including the half-cut three-layer film D3 is obtained. That is, the laminate film 25B includes the base material film 1, the adhesive layer 2, and the half-cut three-layer film D3, in this order. As illustrated in FIG. 12B, the three-layer film D3 has the cut C extending in the thermosetting resin layer 5b partway in the thickness direction by cutting the thermosetting resin layer 5a and the resin layer 6, in a surface on a side opposite to a surface facing the adhesive layer 2. Bonding adhesive pieces 5p are formed by singulating the thermosetting resin layer 5a, and the resin pieces 6p are formed by singulating the resin layer 6. In a case where the thickness of the thermosetting resin layer 5b is set to 100, the cut C may be formed by cutting the thermosetting resin layer 5b to a thickness of 10 to 75 (more preferably 25 to 50).

Since the support piece formation laminate films 20A and 20B include the resin layer 6 having rigidity higher than that of the thermosetting resin layer 5, excellent pickup properties can be attained without performing a thermal curing treatment with respect to the thermosetting resin layer 5 after being singulated by dicing.

In the support piece formation laminate films 20A and 20B, a metal layer having rigidity higher than that of the thermosetting resin layer (for example, a copper layer or an aluminum layer) may be adopted instead of the resin layer 6. The thickness of the metal layer, for example, is 5 to 100 μm, and may be 10 to 90 μm or 20 to 80 μm. Since the support piece formation laminate films 20A and 20B include the metal layer, in addition to excellent pickup properties, excellent visibility of the support piece can be attained in the pickup process by optical contrast between a resin material and a metal material.

INDUSTRIAL APPLICABILITY

According to the present disclosure, a method for efficiently manufacturing a support piece excellent in pickup properties is provided. In addition, according to the present disclosure, a method for manufacturing a semiconductor device having a dolmen structure by using the support piece described above is provided.

REFERENCE SIGNS LIST

1: base material film, 1a: inside region, 2: adhesive layer, 2a: circumferential edge region, 5, 5a, 5b: thermosetting resin layer, 5p: bonding adhesive piece, 6: resin layer, 6p: resin piece, 10: substrate, 20, 20A, 20B: support piece formation laminate film, 25, 25A, 25B: laminate film, 50: sealing material, 100: semiconductor device, C: cut, D: support piece formation film, D2: two-layer film (support piece formation film), D3: three-layer film (support piece formation film), Da: support piece, Dc: support piece (cured product), DR: dicing ring, H: heater, T1: first chip, T2: second chip, T2a: adhesive piece-attached chip, Ta: bonding adhesive piece, Tc: bonding adhesive piece (cured product).

The invention claimed is:

1. A manufacturing method for a support piece used in manufacturing of a semiconductor device having a dolmen structure, the semiconductor device comprising: a substrate; a first chip disposed on the substrate; a plurality of support pieces disposed around the first chip on the substrate; and a second chip disposed to be supported by the plurality of support pieces and to cover the first chip, the method comprising processes of:
(A) preparing a laminate film comprising a base material film, an adhesive layer and a support piece formation film in order; and
(B) forming the support pieces on a surface of the adhesive layer by singulating the support piece formation film,
wherein the support piece formation film is a resin film comprising at least a thermosetting resin layer, and
wherein the process (B) comprises:
forming a partial cut in the support piece formation film that extends in a thickness direction of the support piece formation film, so as to partially cut into the thermosetting resin layer; and
singulating the support piece formation film in a cooled state by imparting an expansion to the laminate film that stretches the base material film and the adhesive layer, wherein the support piece formation film is caused to split from the partial cut in the thickness direction in response to a stretching of the adhesive layer.

2. The manufacturing method according to claim 1,
wherein the base material film has thermal contractility,
wherein the adhesive layer comprises a circumferential edge region that is not covered by the support piece formation film,
wherein in the process (B), the support piece formation film is singulated in a state in which a dicing ring contacts the circumferential edge region to surround the support piece formation film, and
wherein the method further comprises a process of heating an inside region of the dicing ring of the base material film to contract the base material film of the inside region, after the process (B).

3. The manufacturing method according to claim 1,
wherein the adhesive layer is an ultraviolet-curable adhesive layer, and
wherein the method further comprises a process of irradiating the adhesive layer with an ultraviolet ray, after the process (B).

4. A semiconductor device manufacturing method, the method comprising processes of:
forming the support pieces on the surface of the adhesive layer, by the manufacturing method according to claim 1;
(C) picking up the support pieces from the adhesive layer;
(D) disposing the first chip on a substrate;
(E) disposing the support pieces around the first chip or around a region in which the first chip is to be disposed on the substrate;
(F) preparing an adhesive piece-attached chip comprising the second chip and a bonding adhesive piece provided on one surface of the second chip; and
(G) constructing the dolmen structure of the semiconductor device by disposing the adhesive piece-attached chip on surfaces of the support pieces.

5. The manufacturing method according to claim 1, wherein the support piece formation film is a single-layer film constituted of the thermosetting resin layer.

6. The manufacturing method according to claim 1,
wherein the support piece formation film is constituted of resin layers including the thermosetting resin layer, and
wherein at least a part of the thermosetting resin layer is cured.

7. The manufacturing method according to claim 1,
wherein the laminate film includes a central region in which the adhesive layer is layered between the base material film and the support piece formation film, and a circumferential edge region surrounding the central region, in which the adhesive layer is not covered by the support piece formation film, and
wherein the expansion is imparted via a dicing ring that contacts the adhesive layer along the circumferential edge region, and via a tension ring that is located inside the dicing ring to contact the base material film along the circumferential edge region.

8. The manufacturing method according to claim 1, wherein a depth of the partial cut in the thermosetting resin layer corresponds to 25 to 50% of a total thickness of the support piece formation film.

9. A manufacturing method for a support piece used in manufacturing of a semiconductor device having a dolmen structure, the semiconductor device comprising: a substrate; a first chip disposed on the substrate; a plurality of support pieces disposed around the first chip on the substrate; and a second chip disposed to be supported by the plurality of support pieces and to cover the first chip, the method comprising processes of:
(A) preparing a laminate film comprising a base material film, an adhesive layer, and a support piece formation film in order; and
(B) forming the support pieces on a surface of the adhesive layer by singulating the support piece formation film,
wherein the support piece formation film is a multi-layer film comprising a thermosetting resin layer and a high-rigidity layer having a rigidity greater than a rigidity of the thermosetting resin layer,
wherein the high-rigidity layer is a resin layer or a metal layer,
wherein, in the laminate film, the thermosetting resin layer is positioned between the high-rigidity layer and the adhesive layer, and
wherein the process (B) comprises:
forming a partial cut in the support piece formation film that extends through the high-rigidity layer and partially into the thermosetting resin layer in a thickness direction of the support piece formation film; and
singulating the support piece formation film in a cooled state by imparting an expansion to the laminate film that stretches the base material film and the adhesive layer, wherein the support piece formation film is caused to split from the partial cut in the thickness direction in response to a stretching of the adhesive layer.

10. The manufacturing method according to claim 9, wherein the resin layer is a polyimide layer.

11. The manufacturing method according to claim 9, wherein the metal layer is a copper layer or an aluminum layer.

12. The manufacturing method according to claim 9,
wherein the high-rigidity layer is interposed between a first thermosetting resin layer and a second first thermosetting resin layer of the support piece formation film,
wherein the thermosetting resin layer that is positioned between the high-rigidity layer and the adhesive layer is the second thermosetting resin layer, and
wherein the partial cut is formed to cut through the first thermosetting resin layer in addition to the high-rigidity layer.

13. The manufacturing method according to claim 9,
wherein the laminate film includes a central region in which the adhesive layer is layered between the base material film and the support piece formation film, and a circumferential edge region surrounding the central region, in which the adhesive layer is not covered by the support piece formation film, and
wherein the expansion is imparted via a dicing ring that contacts the adhesive layer along the circumferential edge region, and via a tension ring that is located inside the dicing ring to contact the base material film along the circumferential edge region.

14. A laminate film comprising, in order:
a base material film;
an adhesive layer; and
a support piece formation film comprising a first thermosetting resin layer, a second thermosetting resin layer and a high-rigidity layer having a rigidity greater than a rigidity of the first thermosetting resin layer,
wherein the high-rigidity layer is interposed between the first thermosetting resin layer and the second first thermosetting resin layer,
wherein the second thermosetting resin layer is positioned between the high-rigidity layer and the adhesive layer,
wherein the support piece formation film has a first surface and a second surface opposite to the first surface to face the adhesive layer, and
wherein the support piece formation film has a partial cut extending through the first thermosetting resin layer, through the high-rigidity layer and partially in the second thermosetting resin layer in a thickness direction from the first surface.

15. The laminate film according to claim 14, wherein a depth of the partial cut in the second thermosetting resin layer corresponds to 25 to 50% of a total thickness of the second thermosetting resin layer.

* * * * *